(12) United States Patent
Tsujimura et al.

(10) Patent No.: US 7,612,499 B2
(45) Date of Patent: Nov. 3, 2009

(54) IMAGE DISPLAY (75) Inventors: Takatoshi Tsujimura, Kanagawa (JP); Atsushi Tanaka, Kanagawa (JP); Shinya Ono, Kanagawa (JP)

(73) Assignee: Chi Mei Optoelectronics Corp., Tainan (TW)

( * ) Notice: Subject to any disclaimer, the term of this patent is extended or adjusted under 35 U.S.C. 154(b) by 478 days.

(21) Appl. No.: 11/159,327

(22) Filed: Jun. 23, 2005

(65) Prior Publication Data
US 2006/0001033 A1    Jan. 5, 2006

(30) Foreign Application Priority Data
Jun. 24, 2004    (JP) .............................. 2004-186965

(51) Int. Cl.
*H05B 33/04* (2006.01)
(52) U.S. Cl. ...................................... 313/506; 313/505
(58) Field of Classification Search .......... 313/498–512
See application file for complete search history.

(56) References Cited

U.S. PATENT DOCUMENTS

| | | | |
|---|---|---|---|
| 6,107,734 A * | 8/2000 | Tanaka et al. ................ | 313/506 |
| 6,693,296 B1 | 2/2004 | Tyan | |
| 6,867,540 B2 * | 3/2005 | Morley et al. ................ | 313/505 |
| 7,227,305 B2 * | 6/2007 | Liu et al. ..................... | 313/506 |
| 2002/0140343 A1 * | 10/2002 | Hirabayashi ................ | 313/493 |
| 2003/0222574 A1 | 12/2003 | Morley et al. | |
| 2004/0113873 A1 * | 6/2004 | Shirasaki et al. .............. | 345/76 |
| 2006/0220544 A1 * | 10/2006 | Okuyama et al. ........... | 313/506 |

FOREIGN PATENT DOCUMENTS

CN    1484323 A    3/2004

OTHER PUBLICATIONS

Matsumoto et al., "Multiphoton emission OLED: structure and property", IDW, 2003, pp. 1285-1288.

* cited by examiner

*Primary Examiner*—Nimeshkumar D. Patel
*Assistant Examiner*—Anthony T Perry
(74) *Attorney, Agent, or Firm*—Birch, Stewart, Kolasch & Birch, LLP (57) ABSTRACT

An image display according to one aspect of the present invention includes a light emitting unit that is located in each unit pixel area in each, emits light corresponding to an injected electric current, and includes a plurality of light emitting layers which are horizontally divided into. The plurality of light emitting layers are electrically connected in series.

6 Claims, 9 Drawing Sheets

IMAGE DISPLAY

BACKGROUND OF THE INVENTION

1. Field of the Invention

The present invention relates to an image display using an organic electronic luminescent (EL) element, for example, and more particularly to an image display capable of decreasing an amount of electric current per unit pixel with a low cost.

2. Description of the Related Art

Conventionally proposed image displays employing an organic EL element utilize a function of the organic EL element which emits light by recombining positive holes and electrons injected into a light emitting layer thereof.

Such image display includes, for example, a plurality of pixel circuits arranged in a matrix, a signal line driving circuit which supplies a luminance signal described later through a plurality of signal lines, and a scanning line driving circuit which supplies a scanning signal to the pixel circuits through a plurality of scanning lines for selection of a pixel circuit to which a luminescence signal is to be supplied.

Figure 9:
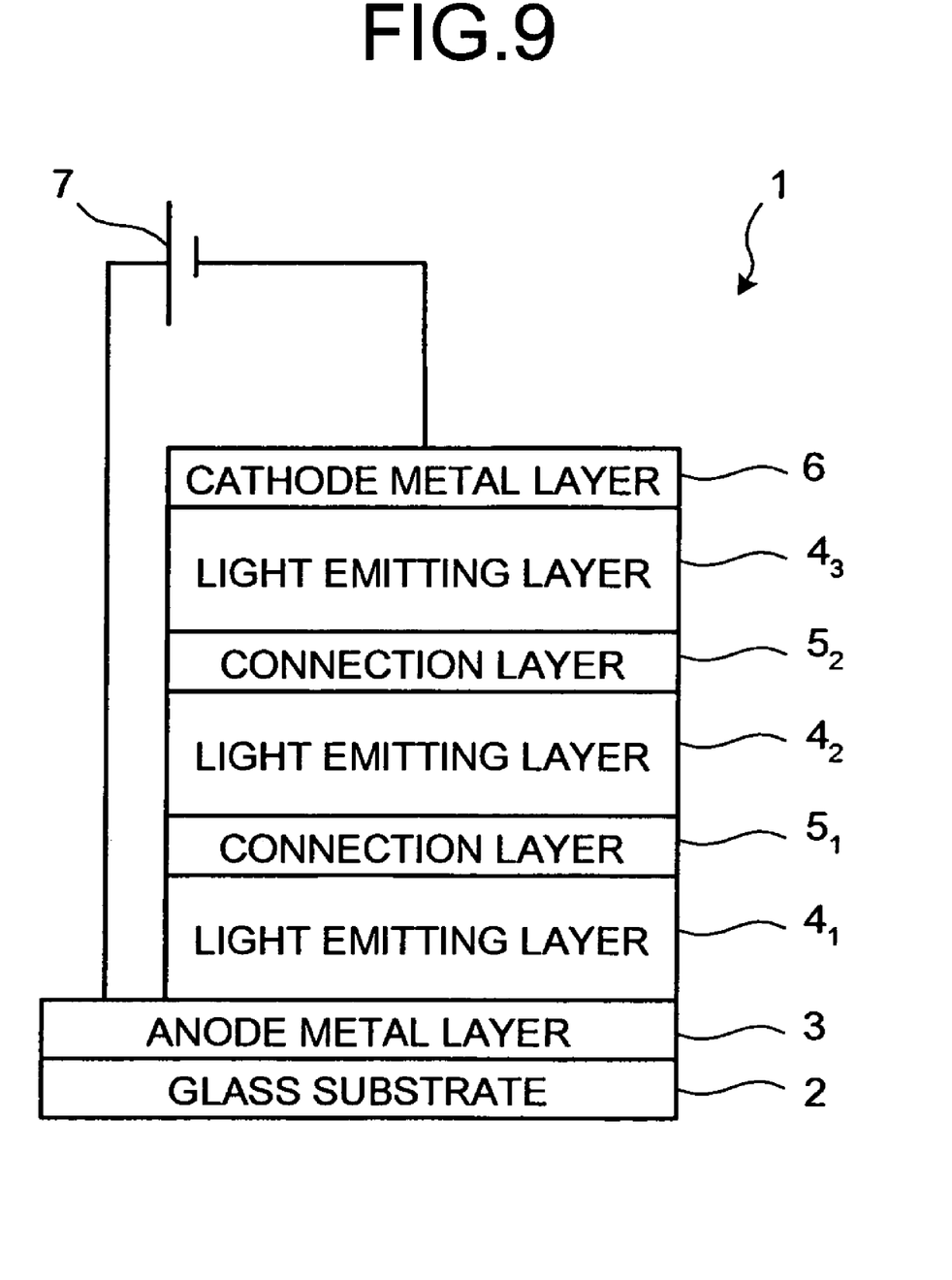
FIG. 9 is a side view of a structure of a conventional image display.

FIG. 9 is a side view of a structure of a conventional image display 1. The image display shown in FIG. 9 includes on a glass substrate 2, an anode metal layer 3, a light emitting layer $4_1$, a connection layer $5_1$, a light emitting layer $4_2$, a connection layer $5_2$, a light emitting layer $4_3$, and a cathode metal layer 6 sequentially stacked in this order. A power source 7 is connected between the anode metal layer 3 and the cathode metal layer 6 under control by a control circuit not shown. The light emitting layers $4_1$ to $4_3$ are electrically connected in series and correspond with the organic EL elements mentioned above, respectively.

In the above described structure, when the anode metal layer 3 and the cathode metal layer 6 are connected to the power source 7, the light emitting layers $4_1$ to $4_3$ each emit light. Thus, the conventional image display 1 can enhance the luminance per pixel unit and reduce the amount of electric current per unit pixel by employing the structure where the light emitting layers $4_1$ to $4_3$ are stacked one on another with the connection layers $5_1$ to $5_2$ interposed therebetween.

One of the conventional displays as described above is disclosed in A. Matsumoto et al., IDW' 03, pp. 1285.

Though the conventional image display 1 is advantageous in enhancing the luminance per pixel unit and reducing the amount of electric current per pixel unit by employing the layer of light emitting layers $4_1$ to $4_3$ stacked one on another, the increase in the number of stacked layers also results in the increase in the number of manufacturing processes as well as the manufacturing cost.

SUMMARY OF THE INVENTION

In view of the foregoing, an object of the present invention is to provide an image display which is capable of reducing an amount of electric current per pixel unit at a low cost.

An image display according to one aspect of the present invention includes a light emitting unit that is located in each unit pixel area in each, emits light corresponding to an injected electric current, and includes a plurality of light emitting layers which are horizontally divided. The plurality of light emitting layers are electrically connected in series.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter an image display according to embodiments of the present invention will be described in detail with reference to the accompanying drawings. It should be noted that the present invention is not limited to the embodiments described below.

Figure 1:
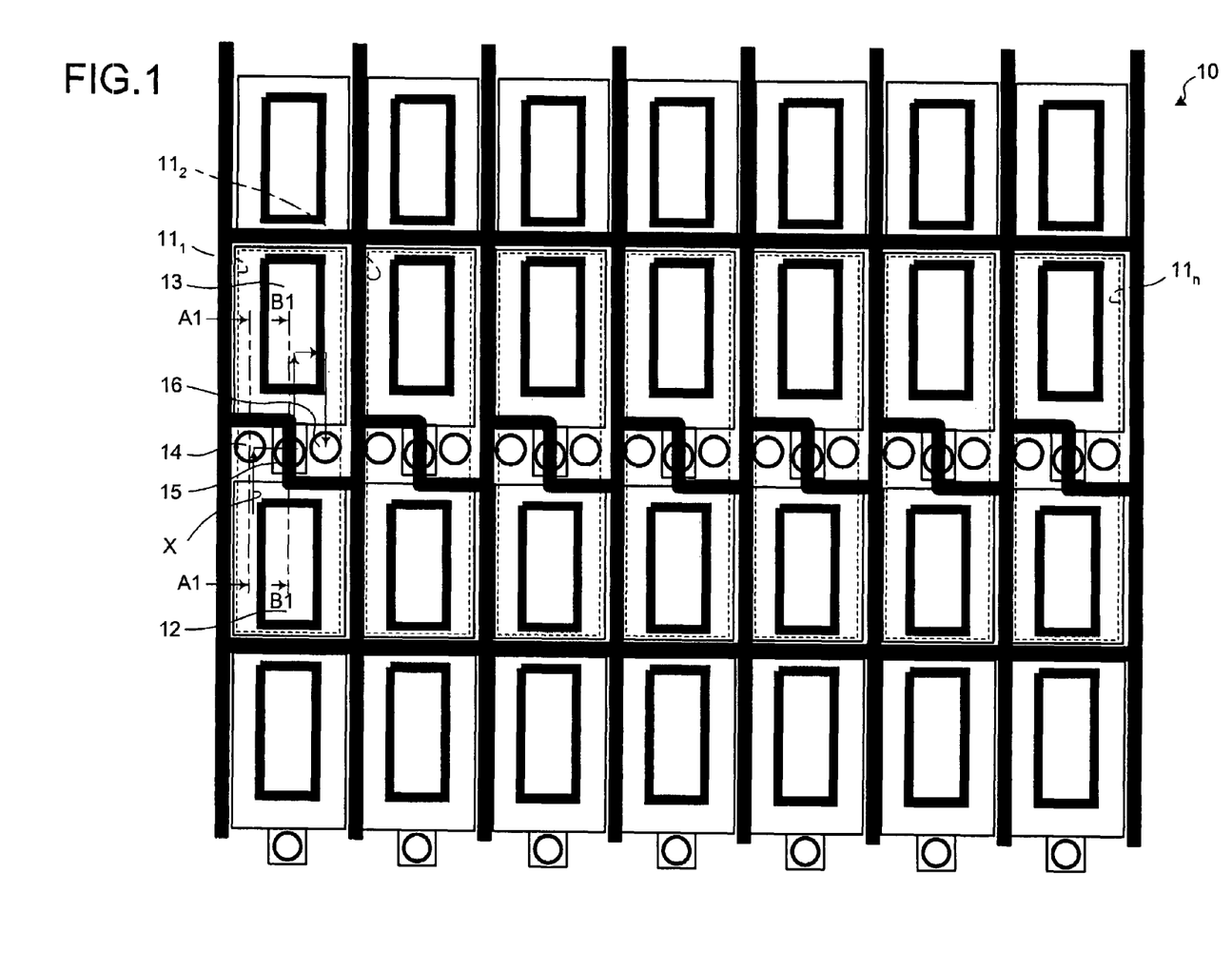
FIG. 1 is a plan view of a structure of an image display according to a first embodiment of the present invention.
Figure 2:
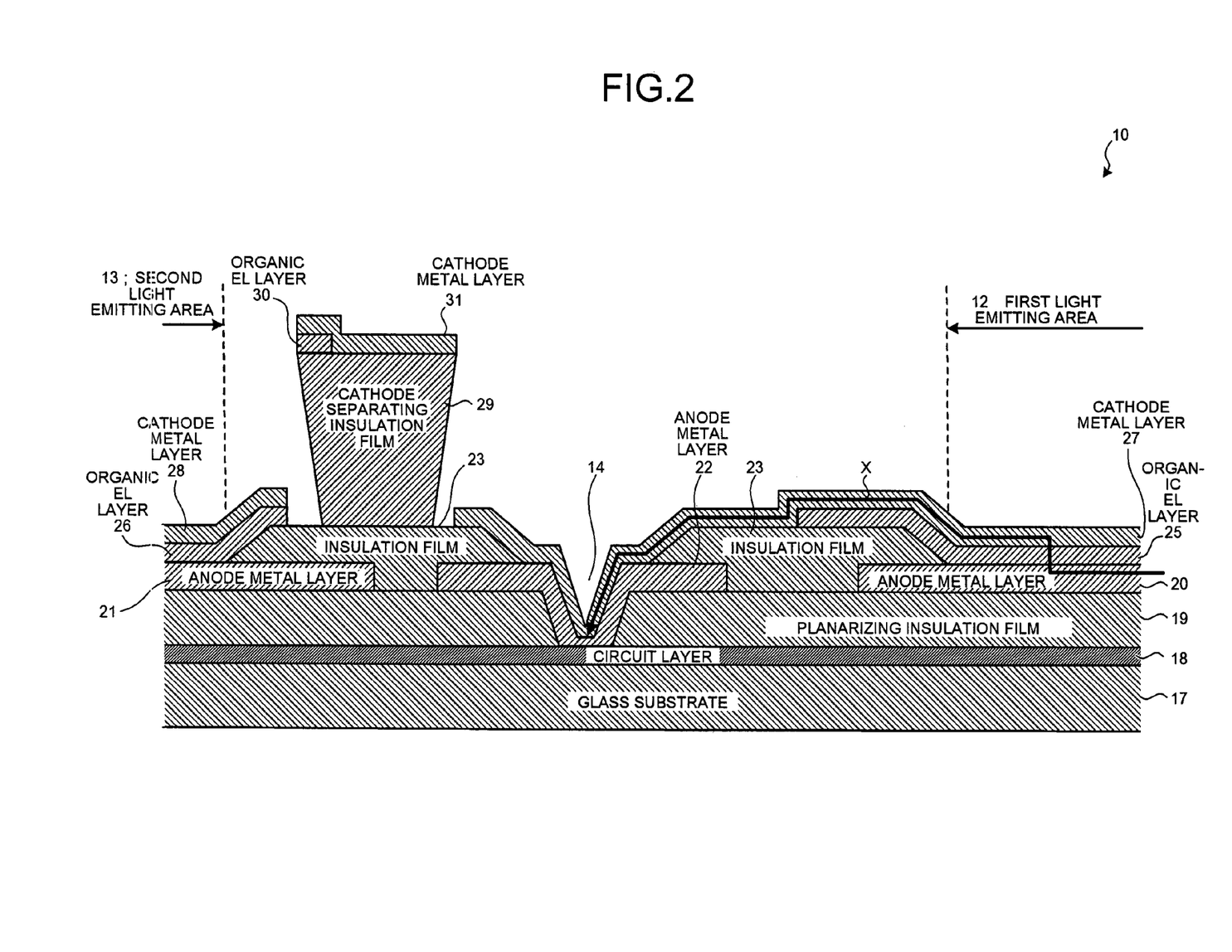
FIG. 2 is a perspective section along A1-A1 shown in FIG. 1.
Figure 3:
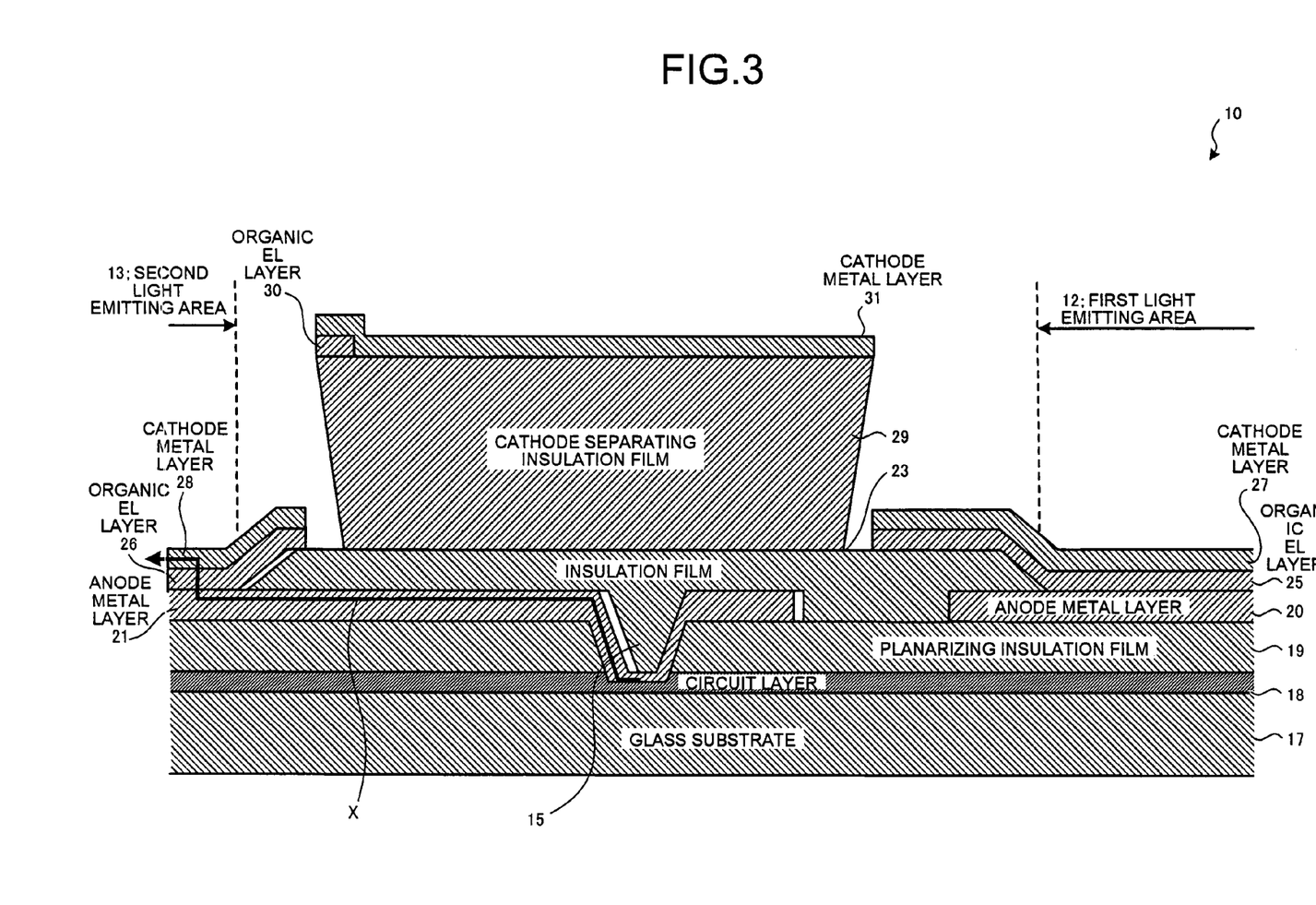
FIG. 3 is a perspective section along B1-B1 shown in FIG. 1.

FIG. 1 is a plan view of an image display 10 according to a first embodiment of the present invention. FIG. 2 is a perspective section along A1-A1 shown in FIG. 1. FIG. 3 is a perspective section along B1-B1 shown in FIG. 1.

The image display 10 shown in FIG. 1 includes a plurality of pixel areas $11_1$ to $11_n$ arranged in a matrix, and emits light using the organic EL elements mentioned above. Each of the pixel areas $11_1$ to $11_n$ corresponds to one pixel. The pixel areas $11_1$ to $11_n$ are formed in a same layer adjacent with each other and electrically connected in series. The image display 10 is manufactured according to known techniques such as vapor deposition and printing.

Specifically, the pixel area $11_1$ includes two light emitting areas, i.e., a first light emitting area 12 and a second light emitting area 13. The dimension of the area from which the light is emitted is substantially the same in the first light emitting area 12 and the second light emitting area 13. Between the first light emitting area 12 and the second light emitting area 13, via holes 14, 15, and 16 are formed in a shape of a groove. The via holes 14, 15, and 16 are used as interconnection of layers. In the pixel area $11_1$, the electric current flows through a path X shown in FIG. 1.

Next, with reference to FIGS. 2 and 3, a sectional structure of the image display 10 will be described. In the image display 10 shown in FIG. 2, on a glass substrate 17, a circuit layer 18 including elements such as a switching element, and a planarizing insulation film 19 are formed. On the surface of the planarizing insulation film 19, an anode metal layers 20, 21, and 22, and an insulation film 23 are formed.

In FIG. 2, the anode metal layer 20 is an anode of the first light emitting area 12 (organic EL layer 25). The anode metal layer 21 is formed at a position corresponding to the via hole 15 (see FIG. 3). The anode metal layer 21 is an anode of the second light emitting area 13 (organic EL layer 26). The anode metal layer 22 is formed at a position corresponding to the via hole 14 (see FIG. 2). The insulation film 23 is formed as to cover the anode metal layers 20 and 21.

The organic EL layer 25 serves as a light emitting layer which recombines injected positive holes and electrons to emit light in the first light emitting area 12. A cathode metal layer 27 is formed on surfaces of the organic EL layer 25, the insulation film 23, and the anode metal layer 21, and serves as a cathode of the first light emitting area 12 (organic EL layer 25). The cathode metal layer 27 is electrically connected to the anode metal layer 21 through the via hole 14. The anode metal layer 20, the organic EL layer 25, and the cathode metal layer 27 correspond to the organic EL elements in the first light emitting area 12.

The organic EL layer 26 serves as a light emitting layer which recombines injected positive holes and electrons to emit light in the second light emitting area 13. A cathode metal layer 28 is formed on surfaces of the organic EL layer 26, and serves as a cathode of the second light emitting area 13 (organic EL layer 26). The anode metal layer 21, the organic EL layer 26, and the cathode metal layer 28 correspond to the organic EL elements in the second light emitting area 13. The dimension of the area from which the light is emitted is substantially same in the second light emitting area 13 and in the first light emitting area 12, i.e., the area from which the light is emitted in the second light emitting area 13 is in the range of 90% to 110% that of the first light emitting area 12. Thus, Neither one of the first light emitting area 12 or the second light emitting area 13 has extremely large electric current density, whereby both light emitting elements can function well for a long period.

A cathode separating insulation film 29 is formed on a surface of the insulation film 23. On a surface of the cathode separating insulation film 29, an organic EL layer 30 and a cathode metal layer 31 are formed. The cathode metal layer 31 and the organic EL layer 30 are, however, formed simply for manufacturing requirements and do not contribute to the light emission.

Thus, in the pixel area $11_1$ of the image display 10, the organic EL element (the anode metal layer 20, the organic EL layer 25, and the cathode metal layer 27) in the first light emitting area 12 and the organic EL element (the anode metal layer 21, the organic EL layer 26, and the cathode metal layer 28) in the second light emitting area 13 are formed in the same layer adjacent to each other and electrically connected in series.

In the above described structure, the electric current flows sequentially along a path X, i.e., along the anode metal layer 20, the organic EL layer 25, the cathode metal layer 27, the anode metal layer 22 respectively shown in FIG. 2, and then to the anode metal layer 21, the organic EL layer 26, and the cathode metal layer 28 shown in FIG. 3, thereby causing the organic EL layer 25 (in the first light emitting area 12) and the organic EL layer 26 (in the second light emitting are 13) simultaneously emit light.

As described above, in the pixel area $11_1$ (unit pixel area) according to the first embodiment, the organic EL layer which emits light corresponding to the injected electric current is horizontally divided into plural elements, and the resulting organic EL elements are electrically connected in series. Hence, compared with the conventional structure where the plural light emitting layers (see FIG. 9) are stacked one on another, the manufacturing process is simplified and the reduction in the amount of electric current per unit pixel can be achieved at a low cost.

In the first embodiment described above, the cathode (cathode metal layer 27) of the first light emitting area 12 is connected to the anode (anode metal layer 21) of the second light emitting area 13 through the groove-like via hole (via hole 14, see FIG. 2). The via hole, however, can be replaced with a relatively planar pad to connect to anode and the cathode. Hereinbelow such structure will be described as a second embodiment.

Figure 4:
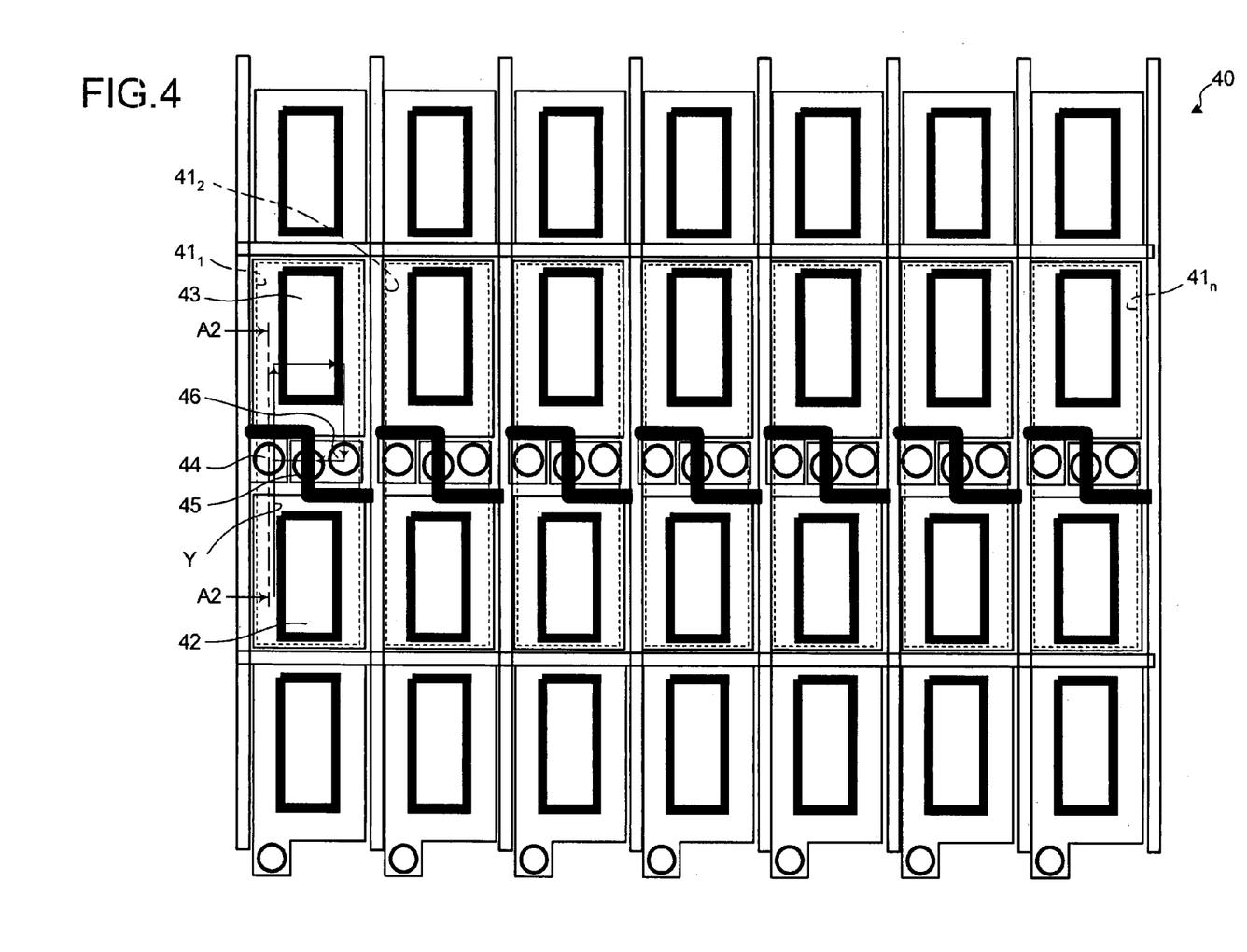
FIG. 4 is a plan view of a structure of an image display according to a second embodiment of the present invention.
Figure 5:
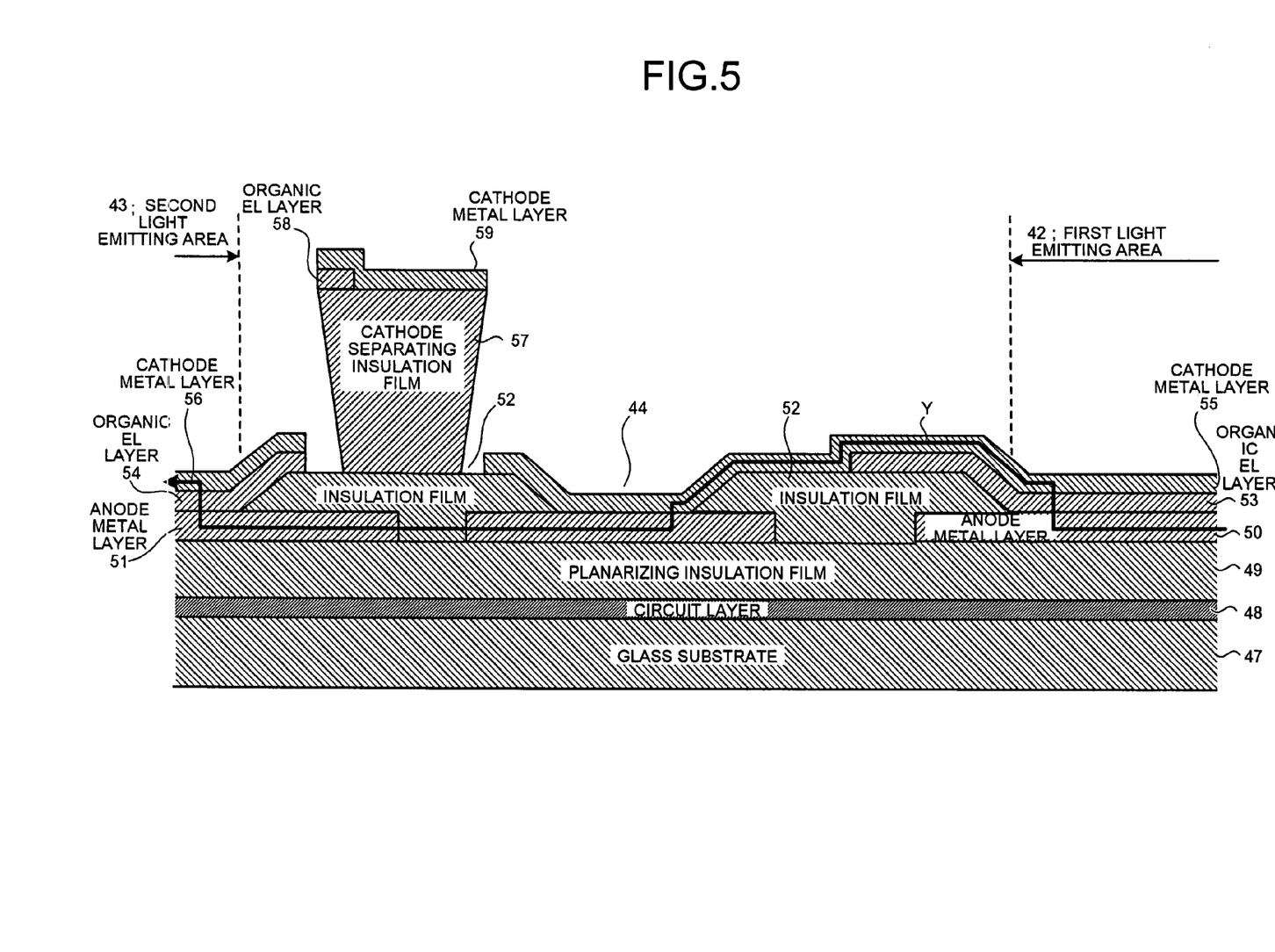
FIG. 5 is a perspective section along A2-A2 shown in FIG. 4.

FIG. 4 is a plan view of a structure of an image display 40 according to the second embodiment of the present invention. FIG. 5 is a perspective section along A2-A2 shown in FIG. 4.

The image display 40 shown in FIG. 4 includes a plurality of pixel areas $41_1$ to $41_n$ arranged in a matrix, and employs the organic EL elements as mentioned above to emit light. Each of the pixel areas $41_1$ to $41_n$ corresponds to one pixel. The pixel areas $41_1$ to $41_n$ are formed in a same layer adjacent to each other and electrically connected in series. The image display 40 is manufactured according to well known techniques such as vapor deposition and printing.

Specifically, the pixel area $41_1$ includes two light emitting areas, i.e., a first light emitting area 42 and a second light emitting area 43. A pad 44, a via hole 45, and a pad 46 are formed between the first light emitting area 42 and the second light emitting area 43. The pads 44 and 46 connect the anode and the cathode.

Next, with reference to FIG. 5, a sectional structure of the image display 40 will be described. The image display shown in FIG. 5 includes, on a glass substrate 47, a circuit layer 48 including elements such as a switching element; and a planarizing insulation film 49 formed from an insulating material stacked one on another. On a surface of the planarizing insulation film 49, anode metal layers 50 and 51, and an insulation film 52 are formed.

The anode metal layer 50 is an anode of the first light emitting area 42 (organic EL layer 53). The anode metal layer 51 is an anode of the second light emitting area 43 (organic EL layer 54). The insulation film 52 is formed so that a cathode metal layer 55 or 56 forms a short circuit with the anode metal layer 50 or 51 outside a region where the organic layers 53 and 54 are formed.

The organic EL layer 53 serves as a light emitting layer which recombines the injected positive holes and the electrons to emit light in the first light emitting area 42. The cathode metal layer 55 is formed on surfaces of the organic EL layer 53, the insulation film 52, and the anode metal layer 51, and serves as a cathode in the first light emitting area 42 (organic EL layer 53). The cathode metal layer 55 is electrically connected to the anode metal layer 51 through the pad 44. The pad 44 is present on the planarizing insulation film 49 which covers the circuit layer 48. The anode metal layer 50, the organic EL layer 53, and the cathode metal layer 55 correspond with the organic EL elements in the first light emitting area 42.

The organic EL layer 54 serves as a light emitting layer which recombines the injected positive holes and the electrons to emit light in the second light emitting area 43. The cathode metal layer 56 is formed on surfaces of the organic EL layer 54, and serves as a cathode in the second light emitting area 43 (organic EL layer 54). The anode metal layer 51, the organic EL layer 54, and the cathode metal layer 56 correspond with the organic EL elements in the second light emitting area 43.

A cathode separating insulation film 57 is formed on a surface of the insulation film 52. On a surface of the cathode separating insulation film 57, an organic EL layer 58 and a cathode metal layer 59 are formed. Here, the organic EL layer 58 and the cathode metal layer 59 are formed for manufacturing requirements and does not contribute to the light emission.

Thus, in the pixel area $41_1$ of the image display 40, similarly to the first embodiment, the organic EL element (the anode metal layer 50, the organic EL layer 53, and the cathode metal layer 55) in the first light emitting area 42 and the organic EL element (the anode metal layer 51, the organic EL layer 54, and the cathode metal layer 56) in the second light emitting area 43 are formed in the same layer adjacent to each other and electrically connected in series. In addition, since the first light emitting area 42 is electrically connected with the second light emitting area 43 through the pad 44 not through the via hole, the number of via holes formed per unit pixel area can be reduced and a wider light emitting area can be secured.

In the above described structure, the electric current flows along a path Y (see FIG. 4), i.e., along the anode metal layer 50, the organic EL layer 53, the cathode metal layer 55, the anode metal layer 51, the organic EL layer 54, and the cathode metal layer 56 shown in FIG. 5, thereby causing the organic EL layer 53 (in the first light emitting area 42) and the organic El layer 54 (in the second light emitting area 43) simultaneously emit light.

As described above, the second embodiment exerts the same effect as the first embodiment.

Figure 6:
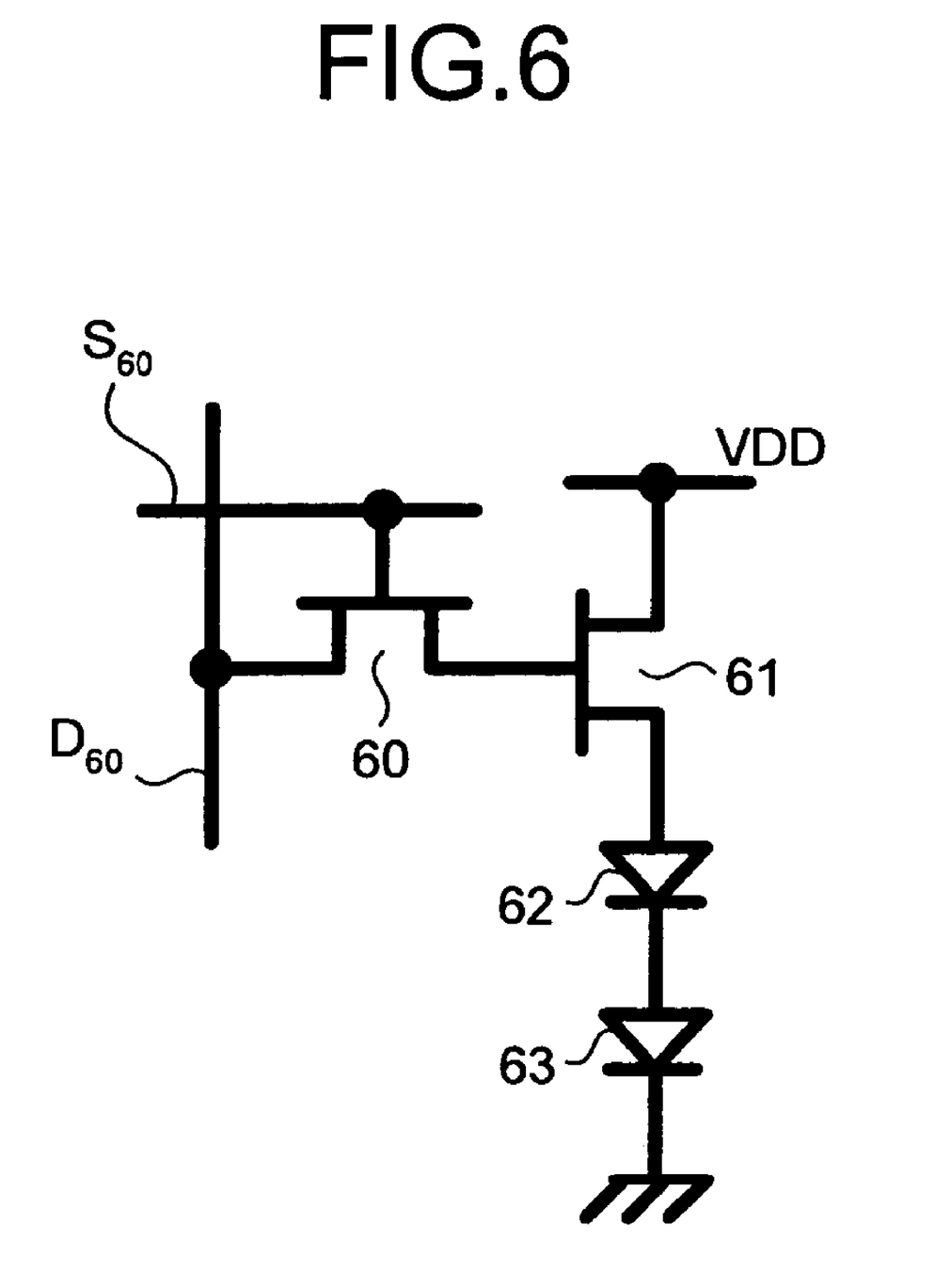
FIG. 6 is a diagram of a circuit example 1 according to a third embodiment of the present invention.
Figure 7:
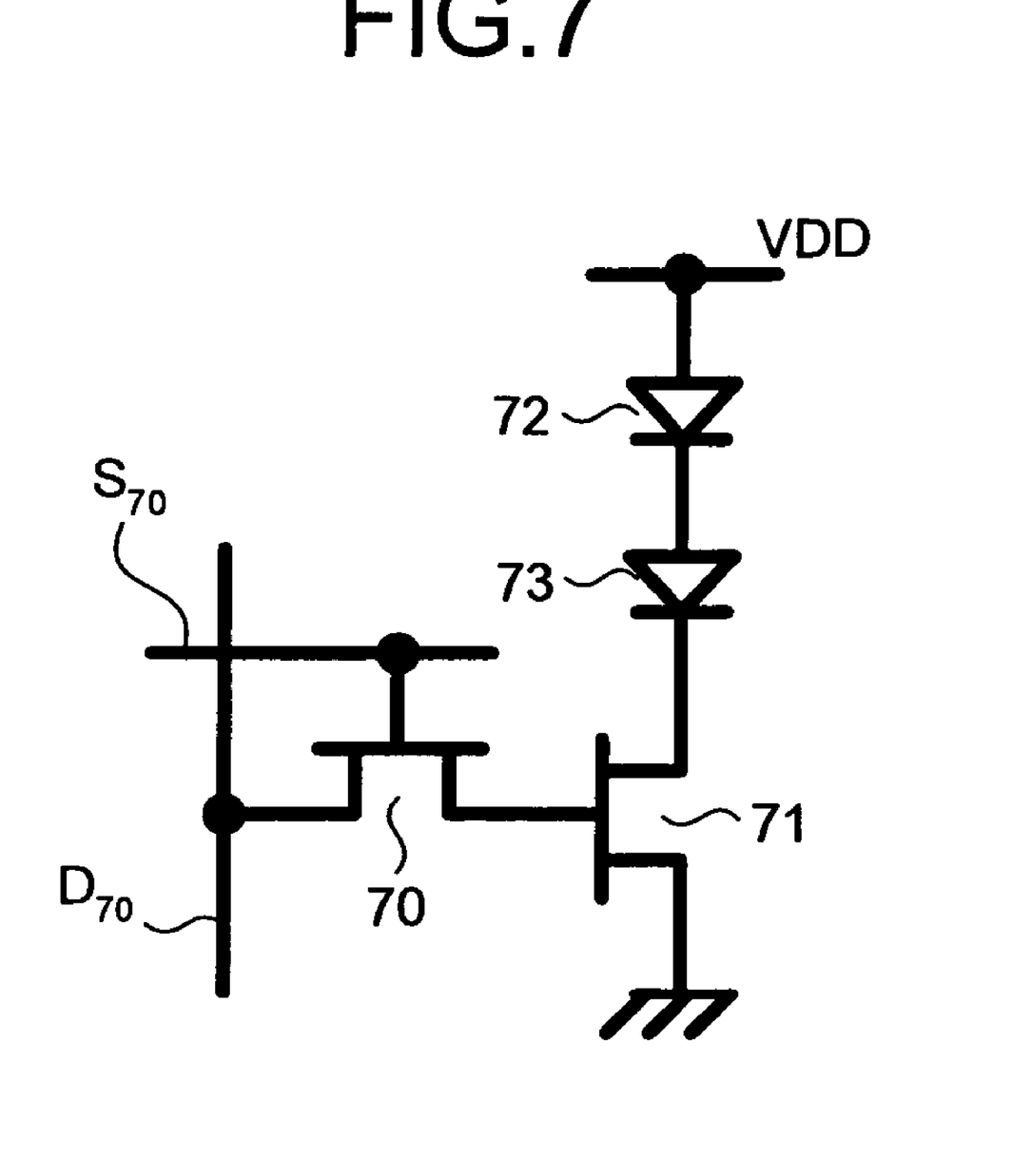
FIG. 7 is a diagram of a circuit example 2 according to the third embodiment of the present invention.
Figure 8:
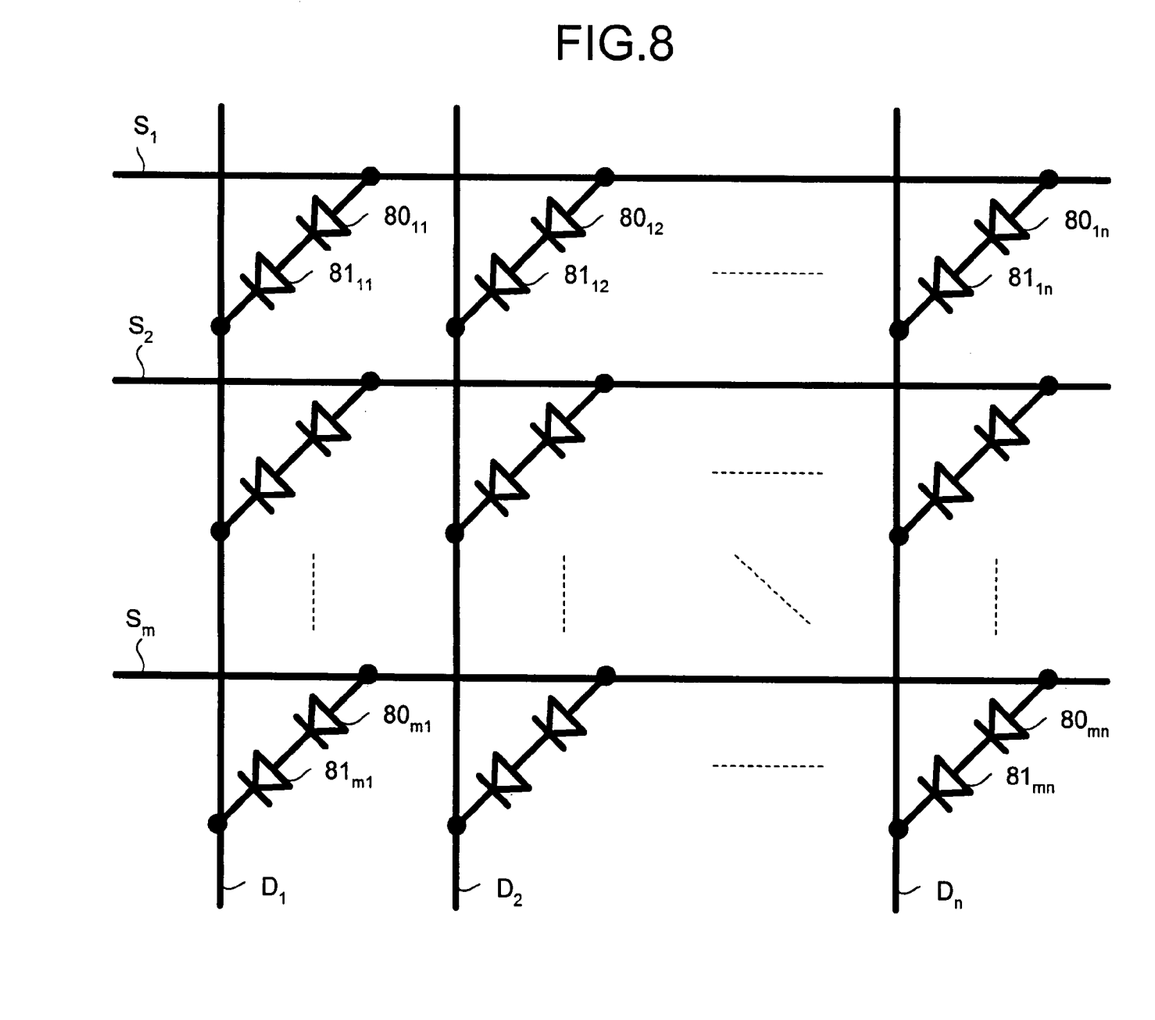
FIG. 8 is a diagram of a circuit example 3 according to the third embodiment of the present invention.

Though in the description of the first and the second embodiments the application to specific circuits is not mentioned, the embodiments are applicable to circuits shown in FIGS. 6 to 8. Hereinbelow, such application will be described as a third embodiment. A circuit shown in FIG. 6 corresponds to one pixel in the image display, and includes a thin film transistor 60 connected to a scanning line S60 and a data line $D_{60}$, a thin film transistor 61, a first organic EL element 62, and a second organic EL element 63. The circuit of FIG. 6 is a drain ground type.

The first organic EL element 62 and the second organic EL element 63 are connected in series and correspond to the organic EL elements in the first light emitting area 12 and the second light emitting area 13 shown in FIG. 1. The first organic EL element 62 and the second organic EL element 63 are connected in series, and correspond to the organic EL elements in the first light emitting area 42 and the second light emitting area 43 shown in FIG. 4. The thin film transistor 61 controls the amount of electric current flowing through the first organic EL element 62 and the second organic EL element 63, thereby changing the luminance of the first organic EL element 62 and the second organic EL element 63.

A circuit shown in FIG. 7 corresponds to one pixel in the image display, and includes a thin film transistor 70 connected to a scanning line $S_{70}$ and a data line $D_{70}$, a thin film transistor 71, a first organic EL element 72, and a second organic EL element 73. The circuit of FIG. 7 is a source ground type.

The first organic EL element 72 and the second organic EL element 73 are connected in series and correspond to the organic EL elements in the first light emitting are 12 and the second light emitting area 13 shown in FIG. 1. Further, the first organic EL element 72 and the second organic EL element 73 are connected in series, and correspond to the organic EL elements in the first light emitting area 42 and the second light emitting area 43 shown in FIG. 4. The thin film transistor 71 controls the amount of electric current flowing through the first organic EL element 72 and the second organic El element 73, thereby changing the luminance of the first organic EL element 72 and the second organic EL element 73.

Further, a circuit shown in FIG. 8 corresponds to an image display of a passive control type, i.e., that immediately emits light upon selection of a pixel. The circuit of FIG. 8 includes m scanning lines $S_1$ to $S_m$ (where m is a natural number), n data lines $D_1$ to $D_n$ (where n is a natural number), and plural pairs of organic EL elements $80_{11}$ and $81_{11}$ to $80_{mn}$ and $81_{mn}$ provided at crossing points of the scanning lines and the data lines respectively.

The elements forming each pair of the pairs of organic EL elements $80_{11}$ and $81_{11}$ to $80_{mn}$ and $81_{mn}$ are connected in series, and correspond to the organic EL elements in the first light emitting area 12 and the second light emitting area 13 shown in FIG. 1. In addition, the pairs of organic EL elements $80_{11}$ and $81_{11}$ to $80_{mn}$ and $81_{mn}$ correspond to the organic EL elements in the first light emitting area 42 and the second light emitting area 43 shown in FIG. 4.

As described above, the third embodiment exerts the same effect as the first embodiment.

As can be seen from the foregoing, the image display according to the present invention is useful for the cost saving, and the reduction in the amount of electric current per unit pixel.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An image display, comprising:
 a plurality of pixels, each of which comprises
 a light emitting unit including a first and a second light emitting element horizontally arranged side by side, the first and second light emitting elements being electrically connected in series;
 a first insulation film between the adjacent light emitting elements, the first insulation film being thicker than each of the first and second light emitting elements; and
 a controller including a thin film transistor and configured to control an amount of electric current flowing through the light emitting unit to control a luminance of the light emitting elements of the light emitting unit,
 wherein each of the first and second light emitting elements comprise a first electrode layer, a second electrode layer which is a different layer from the first electrode layer, and an organic EL layer between the first and second electrode layers,
 the second electrode layer of the second light emitting element includes a portion which is under the first insulation film, and
 the first electrode layer of the first light emitting element is electrically connected to the second electrode layer of the second light emitting element.

2. The image display according to claim 1, wherein the light emitting elements include organic electronic luminescent elements.

3. The image display according to claim 1, further comprising:
 a substrate;
 a circuit layer on the substrate; and
 a second insulation film formed on the circuit layer and having a via hole through which the conductive pattern is connected to the circuit layer.

4. The image display according to claim 1, wherein each of the plurality of light emitting elements has a substantially same area from which light is emitted.

5. The image display according to claim 1, wherein the first electrode layer of the first light emitting element is directly connected to the second electrode layer of the second light emitting element in a region which is outside of the first insulating film.

6. An image display, comprising:
- a plurality of pixels, each of which comprises
    - a light emitting unit including a plurality of light emitting elements horizontally arranged side by side, the plurality of light emitting elements being electrically connected in series;
- each of the light emitting elements including a cathode and an anode, a cathode of one of the light emitting elements being electrically connected to an anode of another of the light emitting elements, and the anode of another of the light emitting elements being a different layer from the cathode of the one of the light emitting elements;
- a first insulation film between the adjacent light emitting elements, the first insulation film being thicker than each of the light emitting elements;
- a conductive pattern electrically connecting the adjacent light emitting elements to each other and including a portion which is under the first insulation film; and
- a controller including a thin film transistor and configured to control an amount of electric current flowing through the light emitting element to control a luminance of the light emitting elements of the light emitting unit.

* * * * *

UNITED STATES PATENT AND TRADEMARK OFFICE
CERTIFICATE OF CORRECTION

PATENT NO. : 7,612,499 B2 Page 1 of 1
APPLICATION NO. : 11/159327
DATED : November 3, 2009
INVENTOR(S) : Takatoshi Tsujimura et al.

It is certified that error appears in the above-identified patent and that said Letters Patent is hereby corrected as shown below:

On the Title Page Item (73) should read,

Kyocera Corporation
6 Takeda Tobadono-cho, Fushimi-ku
Kyoto-shi, Kyoto, Japan 612-8501

Chi Mei Optoelectronics Corp.
No. 3, Sec. 1, Huanshi Rd., Tainan Science-Based Industrial Park
Tainan, Taiwan 74144, ROC Signed and Sealed this Fifteenth Day of June, 2010

David J. Kappos
*Director of the United States Patent and Trademark Office*

UNITED STATES PATENT AND TRADEMARK OFFICE
CERTIFICATE OF CORRECTION

PATENT NO.         : 7,612,499 B2                                          Page 1 of 1
APPLICATION NO.    : 11/159327
DATED              : November 3, 2009
INVENTOR(S)        : Tsujimura et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 575 days.

Signed and Sealed this

Nineteenth Day of October, 2010

David J. Kappos
*Director of the United States Patent and Trademark Office*